United States Patent
Zitzlsperger

(10) Patent No.: US 8,946,756 B2
(45) Date of Patent: Feb. 3, 2015

(54) OPTOELECTRONIC SEMICONDUCTOR COMPONENT

(75) Inventor: Michael Zitzlsperger, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 455 days.

(21) Appl. No.: 13/256,213

(22) PCT Filed: Dec. 23, 2009

(86) PCT No.: PCT/EP2009/067890
§ 371 (c)(1),
(2), (4) Date: Jan. 24, 2012

(87) PCT Pub. No.: WO2010/102685
PCT Pub. Date: Sep. 16, 2010

(65) Prior Publication Data
US 2012/0119250 A1    May 17, 2012

(30) Foreign Application Priority Data
Mar. 10, 2009 (DE) .......................... 10 2009 012 517

(51) Int. Cl.
*H01L 33/00* (2010.01)
*H01L 31/0203* (2014.01)
*H01L 33/54* (2010.01)
*H01L 33/48* (2010.01)

(52) U.S. Cl.
CPC ............ *H01L 31/0203* (2013.01); *H01L 33/54* (2013.01); *H01L 33/483* (2013.01)
USPC ..................... 257/99; 257/E33.056

(58) Field of Classification Search
USPC .............................................. 257/99; 438/26
See application file for complete search history.

(56) References Cited

U.S. PATENT DOCUMENTS

| | | | | |
|---|---|---|---|---|
| 6,392,294 | B1* | 5/2002 | Yamaguchi | 257/690 |
| 6,455,356 | B1* | 9/2002 | Glenn et al. | 438/123 |
| 7,227,194 | B2 | 6/2007 | Ono | |
| 7,427,806 | B2* | 9/2008 | Arndt et al. | 257/682 |
| 2002/0079837 | A1* | 6/2002 | Okazaki | 313/512 |
| 2004/0164675 | A1 | 8/2004 | Wang et al. | |
| 2005/0151149 | A1* | 7/2005 | Chia et al. | 257/99 |
| 2005/0221519 | A1* | 10/2005 | Leung et al. | 438/27 |
| 2005/0280017 | A1* | 12/2005 | Oshio et al. | 257/99 |
| 2006/0022215 | A1* | 2/2006 | Arndt et al. | 257/99 |
| 2006/0192224 | A1 | 8/2006 | Ono | |
| 2006/0223238 | A1* | 10/2006 | Koh et al. | 438/123 |

(Continued)

FOREIGN PATENT DOCUMENTS

DE    10 2004 057 804    6/2006
DE    10 2007 033 057    1/2008

(Continued)

*Primary Examiner* — Matthew Landau
*Assistant Examiner* — Igwe U Anya
(74) *Attorney, Agent, or Firm* — Cozen O'Connor

(57) ABSTRACT

An optoelectronic semiconductor component (100) is specified, with a support (1) which has a mounting surface (11) and at least one penetration (3), where the penetration (3) extends from the mounting surface (11) to a bottom surface (12) of the support (1) that lies opposite the mounting surface (11); at least one optoelectronic semiconductor chip (2), which is mounted on the mounting surface (11); a radiation-transparent casting body (5), which surrounds the at least one optoelectronic semiconductor chip (2) at least in places, where the casting body (5) is arranged at least in places in the penetration (3) of the support (1).

16 Claims, 3 Drawing Sheets

(56) References Cited

U.S. PATENT DOCUMENTS

| | | | |
|---|---|---|---|
| 2006/0256706 A1* | 11/2006 | Ito et al. | 369/275.1 |
| 2007/0080357 A1 | 4/2007 | Ishii | |
| 2007/0278512 A1* | 12/2007 | Loh et al. | 257/99 |
| 2008/0037252 A1 | 2/2008 | Nii et al. | |
| 2008/0121921 A1* | 5/2008 | Loh et al. | 257/99 |
| 2009/0224277 A1* | 9/2009 | Leung et al. | 257/98 |
| 2010/0123156 A1* | 5/2010 | Seo et al. | 257/99 |
| 2013/0277705 A1 | 10/2013 | Seo et al. | |

FOREIGN PATENT DOCUMENTS

| | | |
|---|---|---|
| EP | 1 107 332 | 6/2001 |
| JP | 2000-188358 | 7/2000 |
| JP | 2001-127210 | 5/2001 |
| JP | 2006-114832 | 4/2006 |
| JP | 2006-516816 | 7/2006 |
| JP | 2006-237190 | 9/2006 |
| JP | 2007-027433 | 2/2007 |
| JP | 2007-287713 | 11/2007 |
| JP | 2008-041917 | 2/2008 |
| JP | 2008-047617 | 2/2008 |
| JP | 2008-244143 | 10/2008 |
| JP | 2008-244151 | 10/2008 |
| JP | 2009-016636 | 1/2009 |
| JP | 2010-123908 | 6/2010 |
| WO | WO 2004/036660 | 4/2004 |

* cited by examiner

OPTOELECTRONIC SEMICONDUCTOR COMPONENT

RELATED APPLICATIONS

This is a U.S. national stage of application No. PCT/EP2009/067890, filed on Dec. 23, 2009.

This application claims the priority of German application no. 10 2009 012 517.5 filed Mar. 10, 2009, the entire content of which is hereby incorporated by reference.

FIELD OF THE INVENTION

An optoelectronic semiconductor component and a method for making an optoelectronic semiconductor component are specified.

SUMMARY OF THE INVENTION

One object of the invention is to provide a particularly compact and aging-resistant semiconductor component.

In accordance with at least one embodiment the optoelectronic semiconductor component comprises a support. The support can be a metallic support strip (also called a lead frame). For example, the support strip is then formed by two strip-shaped metal strips that serve as electrical contact surfaces.

In addition, the support has a mounting surface and a bottom surface opposite the mounting surface.

The support can also be formed with a base body of an electrically isolating material, for example a ceramic. The base body can then be provided with junction points and conductive paths at the mounting surface and/or the bottom surface.

In addition, the support has at least one penetration, where the penetration extends from the mounting surface to the bottom surface of the support.

In this connection "penetration" means that there is a intersection through the support, preferably in the form of a hole.

On the side the penetration is then bounded by the support, so that the penetration has at least one continuous side surface.

According to at least one embodiment, at least one optoelectronic semiconductor chip is mounted on the mounting surface. The optoelectronic semiconductor chip can, for example, be a luminescence diode chip. The luminescence diode chip can be a light or laser diode chip that emits radiation in the range from ultraviolet to infrared. Preferably, the luminescence diode chip emits light in the visible region or ultraviolet region of the electromagnetic spectrum.

For example, a plurality of semiconductor chips are mounted on the support.

Preferably, the semiconductor chip or chips does not cover the penetration.

According to at least one embodiment the optoelectronic semiconductor component has a radiation-transparent casting body. The casting body is transparent for the electromagnetic radiation generated by the semiconductor chip. This means that radiation generated by the semiconductor chip is essentially not absorbed by the casting body. "Essentially" here means that the casting is at least 80%, preferably 90%, transparent for the primary electromagnetic radiation generated by the optoelectronic semiconductor chip. In addition, the casting body surrounds the at least one optoelectronic semiconductor chip at least in places. "Surrounds at least in places" means in this connection that the casting body encloses the exposed outer surfaces of the semiconductor chip in a form fit at least in places or completely and the casting body directly abuts at least parts of the exposed outer surfaces of the semiconductor chip. It is further possible that in addition the mounting surface of the support is covered at least in places by the casting body. Preferably the casting body is then in direct contact with the mounting surface, so that neither a gap nor a discontinuity is formed between the casting body and the mounting surface. In addition, the casting body is arranged in the penetration of the body at least in places. This means that parts of the casting body fill the penetration at least in places. In other words, this means that the casting body is also introduced in the penetration. However, the casting body must not completely fill the penetration. Advantageously, through the introduction of the casting body into the penetration it becomes possible for the casting body to become anchored to the support, at least in the lateral direction, thus parallel to the mounting surface of the support. Advantageously, the casting body is a continuous body, so that the semiconductor chip and the penetration are connected together by the casting body. Separation of the casting body from the support and at the same time the semiconductor chip in the lateral direction is thus avoided.

According to at least one embodiment of the optoelectronic semiconductor component the semiconductor component comprises a support that has a mounting surface and at least one penetration, where the penetration extends from the mounting surface to a bottom surface of the support that lies opposite the mounting surface. In addition, the optoelectronic semiconductor component has at least one optoelectronic semiconductor chip that is mounted on the mounting surface. In addition, the optoelectronic semiconductor chip comprises a radiation-transparent casting body, which surrounds the at least one optoelectronic semiconductor chip at least in places, where the casting body is arranged in the penetration of the support at least in places.

The optoelectronic semiconductor component described here stems, among other places, from the knowledge that a casting body frequently separates after only a short operating time ("delaminates") from a semiconductor chip that is enclosed at least in places by a casting body and from the support that is covered at least in places by the casting body. This means that a gap or a discontinuity is formed, for example, between the casting body and the semiconductor chip, due to which the optoelectronic semiconductor component can no longer work to its full capacity, since radiation losses or even elevated development of heat can occur due to the process of the separation of the casting body from the semiconductor chip.

Now in order to avoid such separation of the casting from the semiconductor chip and the support, the optoelectronic semiconductor component described here makes use of the idea of using a support with at least one penetration, where the penetration extends from a mounting surface to a bottom surface of the support and at the same time the casting body is at least in places arranged in the penetration of the support.

Advantageously in this way a separation or delamination of the casting body from the semiconductor chip and the support is avoided, at least in the lateral direction. Through this a semiconductor component that is especially resistant to aging is created.

According to at least one embodiment of the optoelectronic semiconductor component the casting material consists of a silicone, an epoxide, a mixture of silicone and epoxide, or contains at least one of these materials. Preferably the casting material is a material that is transparent for the electromagnetic radiation generated by the semiconductor chip.

According to at least one embodiment a radiation decoupling surface of the casting body is made in a lens shape. The electromagnetic radiation generated by this semiconductor chip is decoupled from the semiconductor component at a boundary surface of the casting body. If the semiconductor component is, for example, surrounded by air, the casting body/air interface then forms the radiation decoupling surface of the casting body, via which the electromagnetic radiation is decoupled from the component. In order to avoid, for example, total internal reflections or undesired back reflections, the radiation decoupling surface is made lens shaped.

For example, the radiation decoupling surface has a curved outer surface like that of a condensing lens. Advantageously in this way a semiconductor component that does not require connected optics, for example, for focusing the radiation emitted by the semiconductor chip, becomes possible. This makes it possible to create a component that has an especially low vertical extent. "Vertical" in this connection means perpendicular to the mounting surface.

According to at least one embodiment of the optoelectronic semiconductor component the at least one penetration is formed by at least two recesses in the support that differ from each other with regard to their maximum lateral extent. "Maximum lateral extent" means the maximum spacing of two points of a recess in the lateral direction. If a recess is square in a top view, the maximum lateral extent means, for example, the spacing of two diagonally opposite edges of the recess. If a recess is circular, the maximum lateral extent is the diameter. In addition, a recess can be made up of a plurality of recesses with different lateral extents. In this way it is possible for one recess to be a square stamping and a second recess to be a cylindrical stamping. The relevant maximum lateral extent of each of the two recesses in any case differs from that of the other.

At least one penetration is now made in the support. The penetration is then formed by a "mounting surface side" and a "bottom surface side" recess. "Mounting surface side" in this connection means that the recess is introduced into the support from the mounting surface. A corresponding statement applies to a "bottom surface side" recess. Preferably, the bottom surface side recess has a larger maximum lateral extent than the mounting surface side recess. The heights, i.e., the vertical extent of each recess, must then together make up at least in places the thickness, i.e., the vertical extent, of the support at the places of the recesses. Consequently then the two recesses can form a penetration. In addition, the two recesses can have a common central axis in the vertical direction.

According to at least one embodiment of the optoelectronic semiconductor component the recesses are formed by cylindrical openings with different radii. The cylindrical openings can be drillings and can be introduced by drilling into the support. Likewise it is possible for the cylindrical drillings to be introduced into the support by etching or stamping. A recess is then made on both the mounting surface side and bottom surface side by at least one cylindrical opening. Preferably, the cylindrical opening introduced via the mounting surface has a smaller radius than the cylindrical opening introduced via the bottom surface.

According to at least one embodiment of the optoelectronic semiconductor component the at least at least one penetration has at least one projection or projecting element. Projection in this connection means that, for example starting from the bottom surface, up to the mounting surface of the support, the lateral extent of the penetration "abruptly," for example through a step within the penetration, becomes smaller or larger. "Abruptly" in this connection means that the penetration has a change in the lateral extent in the vertical direction from one point to the next. Likewise it is possible for a penetration to have a plurality of projections. The penetration is then formed, for example, by a plurality of drillings, each with different radius. This then means that the penetration has a plurality of step-like projections and the penetration is structured in this way in the vertical direction, for example by recesses of different size.

According to at least one embodiment the at least one penetration is designed at least in places to be funnel-shaped, where the diameter tapers in the lateral direction toward the mounting surface starting from the bottom surface. "Funnel-shaped" in this connection means that the penetration is designed as a truncated cone and therefore the penetration has at least one continuous and coherent side surface and the radius of the penetration in the funnel-shaped region changes in the vertical direction. Likewise it is possible for the penetration to be formed by a funnel-shaped recess and a drilling. In this case a projection in the form of a step is formed at the point of the transition between the drilling and the funnel. In addition it is possible, for example, for the penetration to be funnel shaped over the entire vertical extent of the support. If the penetration is designed to be funnel-shaped over its entire vertical extent, due to the fact that the penetration tapers in its lateral measurements toward the mounting surface, a hooking or anchoring of the casting body in the penetration becomes possible, which prevents separation of the casting body from the semiconductor chip and the support not only in the lateral direction, but also in the vertical direction. If a projection is formed in the penetration, for example in the form of a step, then in this case as well the penetration prevents not only separation of the casting body from the semiconductor chip and the support in the lateral direction, but also a separation of the casting body from the semiconductor chip and the support in the vertical direction.

This becomes possible due to the fact that the casting body becomes "hooked" with the at least one projection that is in the recess and thus locks the casting body in its position with respect to the semiconductor chip and the support.

Thus, in each of the embodiments described here the penetration represents a structure for anchoring the casting body in the support. Advantageously this prevents the casting body from separating from the support and the semiconductor chip, for example after just a short operating time, and in this way forming, for example, a gap or discontinuity between the semiconductor chip and the casting body.

According to at least one embodiment of the optoelectronic semiconductor component the places on the support that are not covered by the casting body are at least in places covered by a housing body. For example, the housing body covers all exposed places of the bottom surface and all exposed places of the mounting surface and the side surfaces of the support. The mounting body can be formed of a duroplastic or thermoplastic material, for example an epoxide, or can even be made with a ceramic material or can consist of such a material.

According to at least one embodiment the at least one semiconductor chip is bordered on the side by raised areas ("elevations") and/or depressions of the housing body. The housing body then covers at least in places the mounting surface. For example, a through, continuous raised area borders the semiconductor chip in the lateral direction in a circular, oval or rectangular shape.

According to at least one embodiment of the optoelectronic semiconductor component the raised places are designed at least in places to be bead-like. "Bead-like" means in this case that the elevations surround the semiconductor chip in a circular chip and in a cross-sectional view are made, for example, like an inverted "u" or "v."

According to at least one embodiment of the optoelectronic semiconductor element the depressions in the housing body are troughs. "Troughs" in this connection describe, for example, a depression in the form of a recess in the housing body. The troughs then surround the semiconductor chip, for example in a circular shape, where the recess, for example, is "u"- or "v"-shaped in cross section.

According to at least one embodiment of the optoelectronic semiconductor component the casting body transforms the elevations at least in places. "Transforms" in this connection means that the casting body is in direct contact with the elevations, at least in places encloses the elevations and in this way neither a gap nor a discontinuity is formed between the casting body and the elevations. Furthermore, the casting is arranged on both sides of the highest point of an elevation. The "highest point" is the point at which the extent of the elevation in the vertical direction has the greatest value. In this case the elevations form anchoring structures for the casting body, through which a lateral separation of the casting body from the housing body is avoided, for example. The introduction of penetrations into the support offers the advantage of creating a component that not only has anchoring structures, for example in the form of elevations in the housing body, but also has anchoring structures in the support in the form of penetrations. In this respect, therefore, anchoring structures in the housing body are combined with anchoring structures in the support. Through this combination a separation of the casting body from the housing body, the semiconductor chip and the support is avoided, which not only makes the component more stable, but also increases its lifespan.

In addition, it becomes possible through this to reduce the size of such elevations in their vertical extent, since the casting body is already anchored in the support both in the lateral and vertical directions by the anchoring structures. Advantageously in this way it becomes possible to create a component that has an especially small vertical extent and is thus both very flat and compact.

Because, for example, the vertical extent of the elevations is made smaller, in the same way the side surface of an elevation turned toward the semiconductor chip is also made smaller, which leads to an area of the housing body that is as small as possible being exposed to the electromagnetic radiation emitted by the semiconductor chip.

According to at least one embodiment the casting body is arranged at least in places in the depressions. Preferably, the casting body is entirely arranged in the depressions. The depressions, like the elevations, prevent separation of the casting body from the housing body in the lateral direction, for example. In this case as well the height of the depressions can be reduced, since, for example, the anchoring structures in the support already act to prevent lateral separation of the casting body.

Moreover, a method for producing an optoelectronic semiconductor component is specified. A component described here can be produced by means of the method. This means that all characteristics disclosed in connection with the component are also disclosed for the method, and vice versa.

According to a first embodiment of the method a group of supports is initially provided. The group of supports can be a group of supports for a plurality of components. The connection between the individual supports is separated later by separating them into individual components. For example, the supports can each be a support strip which is then formed by two electrically isolated strip-shaped metal strips.

In another step at least one penetration is made into each support of the support group. For example, for this a cylindrical opening is introduced in the form of a drilling from a mounting surface to a bottom surface lying opposite the mounting surface and vice versa into the support is made in each case. Likewise it is possible for a cylindrical opening to be introduced into each support by means of etching or stamping. For example, then the two cylindrical openings each has a different radius, so that a projection in the form of a step is formed within a penetration. Likewise it is possible that the two central axes of the cylindrical openings do not coincide and therefore the cylindrical openings are offset from each other. The height of the relevant cylindrical openings must in each case together have the thickness of the support at the places of the cylindrical openings, so that the penetration is formed. The penetration is freely accessible both from the mounting surface and from the bottom surface.

Further, at least one optoelectronic semiconductor chip is mounted on a mounting surface of each support. The optoelectronic semiconductor chip is mounted on the support and electrical contact is made by means of soldering, for example.

In another step the at least one semiconductor chip and the at least one penetration are potted with a casting material, which then hardens to a casting body. Preferably, both the penetration and the semiconductor chip are potted in one casting process. The casting body can be formed with a material that is transparent to electromagnetic radiation, for example a silicone. In potting the casting material flows into the at least one penetration and hardens within it. After hardening the casting body is anchored in the penetration. Thus a casting body that is introduced both into the penetration and also covers the mounting surface and all exposed outer surfaces of the semiconductor chip at least in places is formed. In this respect the casting body is a cohesive body.

In another process step the group of supports is separated into individual supports. The separation can take place by means of sawing, cutting, breaking or stamping, This allows a particularly economical production of the component.

It is also possible for this sequence to be modified. For example, this can mean that the separation of the support group into individual supports takes place before the application of the at least one optoelectronic semiconductor chip on a mounting surface of each support.

According to at least one embodiment of the method for producing an optoelectronic semiconductor component first a group of supports is provided. At least one penetration is introduced in each support.

In another step at least one optoelectronic semiconductor chip is applied to a mounting surface of each support. In addition, the at least one semiconductor chip and the at least one penetration are potted with a casting material, which then hardens to a casting body. In another step the support group is separated into individual supports.

According to at least one embodiment of the method for producing an optoelectronic semiconductor component the group of supports is potted with a housing body material before potting with the casting material. This advantageously enables, for example, the transforming of the elevations/depressions formed by the housing body by means of the casting body.

BRIEF DESCRIPTION OF THE DRAWINGS

In the embodiment example in the figures like or like-acting components are given the same reference numbers. The elements shown are not to be seen as true to scale, rather individual elements may be exaggerated in size for better understanding.

DETAILED DESCRIPTION OF THE DRAWINGS

Figure 1:
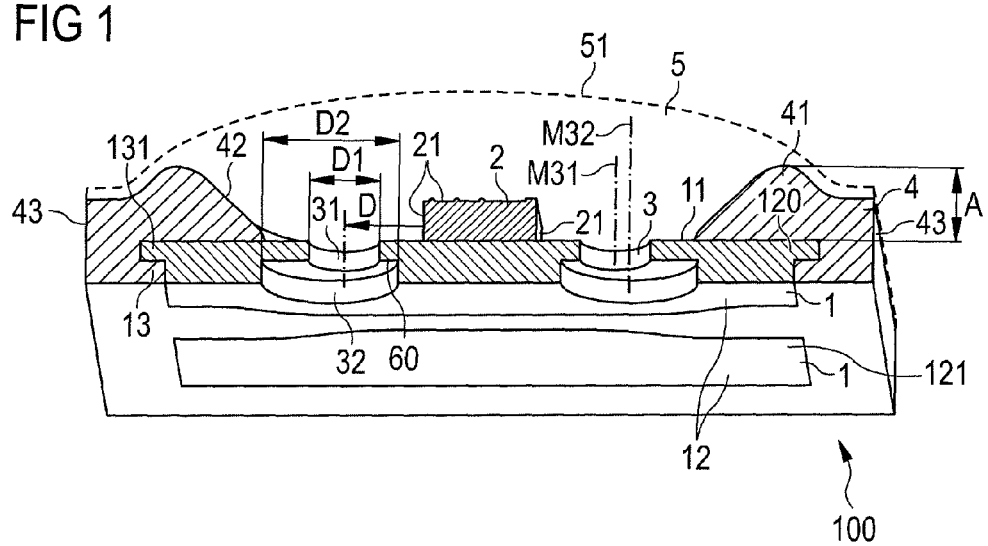
FIG. 1 shows an embodiment example of an optoelectronic component described here along section line A-A, in a schematic perspective sectional view.

In FIG. 1, by means of a schematic perspective sectional view, an optoelectronic semiconductor component 100 as described here, with a support 1, an optoelectronic semiconductor chip 2, which is mounted on a mounting surface 11 of support 1, a housing body 4 and a casting body 5 in accordance with the embodiment example of the component described here is explained in more detail. In this example support 1 is a metallic support strip, via which the semiconductor chip is brought into electrical contact. Here the support 1 is formed by two metallic support parts 121 and 120. The two support parts 121 and 120 are connected together via the housing body and through this are stabilized with respect to each other. The housing body 4 isolates the two support parts 121 and 120 from each other.

In addition, the housing body 4 is formed with a thermoplastic or duroplastic material, for example an epoxide.

The casting 5 forms a radiation decoupling surface 51, through which the electromagnetic radiation emitted by semiconductor chip 2 can be decoupled from the component. Preferably the radiation decoupling surface 51 is made lens-shaped in the form of a condensing lens.

Two penetrations 3 are arranged in support 1. The penetrations 3 are formed by means of two recesses 31 and 32. Here the two recesses 31 and 32 are cylindrical openings in the form of drillings. In addition, the recesses 31 and 32 have central axes M31 and M32. Recess 31 is arranged at a lateral distance D from the side surface 21 of semiconductor chip to the central axis M31. Recess 32 has a diameter D2 and recess 31 has a diameter D1. The central axes M31 and M32 do not coincide, so that the two recesses 31 and 32 are offset from each other. Here the recess 31 has a smaller diameter than recess 32. Because the recesses 31 and 32 have different diameters, thus different lateral measurements, a projection 60 in the form of a step forms within each penetration.

In this embodiment example the casting body 5 is entirely arranged in the two penetrations 3, so that the casting body 5 is anchored to support 1 in penetrations 3 in the vertical and lateral direction because of the projections 60 in the penetrations 3. This means that the casting body is secured both in the lateral and vertical directions, so that neither a gap nor a discontinuity between the outer surfaces 21 of the semiconductor chip 2 and the casting body 5 forms.

Advantageously, a separation of the casting body 5 is prevented in this way. Consequently, a semiconductor component 100 that is especially resistant to aging is created.

In addition, the housing body 4 has bead-like elevations 41, which are transformed by casting body 5 on both sides of their maximum vertical extent. Here the elevations 41 surround the semiconductor chip 2 and the penetrations 3 in a circle. "Transformed" means that the casting body 5 is in direct contact with the elevations and neither a gap nor a discontinuity is formed in between the elevations 41 and the casting body. Advantageously, the elevations 41 enable anchoring of the casting body 5 in the lateral direction, so that separation of the casting body 5 from the housing body 4 is avoided at least in the lateral direction.

In addition, the introduction of the recesses 3 into support 1 allows vertical extent A of elevations 41 to be smaller than with previous semiconductor elements, since the penetrations 3 already anchor the casting body 5 in the lateral direction. Because the vertical extent of the elevations 41 is smaller, likewise the side surfaces 42 become smaller. Consequently, it becomes possible that an area of the housing body 4 that is as small as possible is exposed to the electromagnetic radiation emitted by semiconductor chip 2. Because of that a surface area of the housing body that is as small as possible is damaged or heated by radiation striking it.

In addition, the small vertical extent of elevations 41 enables a component that is especially flat. Here the maximum vertical extent of elevations 41 is two times larger than the vertical extent of the semiconductor chip 2. Likewise it is possible that the semiconductor chip 2 has the same or a larger maximum vertical extent as elevations 41.

To avoid separation of the housing body from the support in the vertical direction, in this embodiment example the support 1 has an additional anchoring structure 13 in the form of a step 131. The anchoring structure 13 is completely transformed by the housing body 4 and additionally prevents separation of support 1 from housing body 4, for example in the vertical direction.

Figure 2:
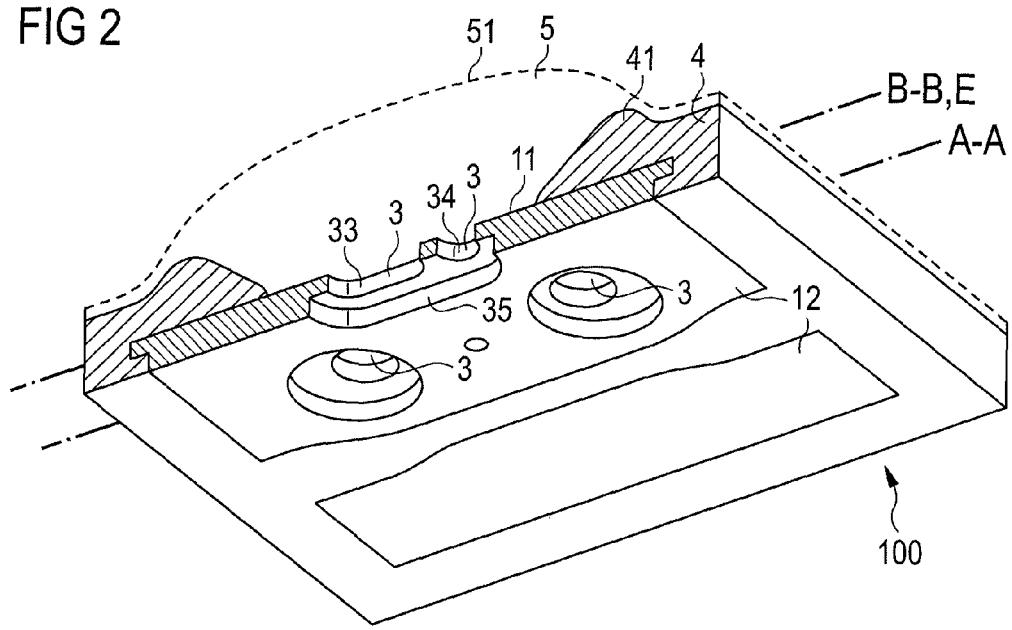
FIG. 2 shows the semiconductor element along section line B-B in a schematic perspective sectional view.

In a schematic perspective sectional view FIG. 2 shows the optoelectronic semiconductor component 100 as in FIG. 1. One can see that two additional penetrations 3 are introduced into the support. For this two recesses 33 and 34 are introduced into support 1 from the mounting side in the direction of a bottom surface 12. The recess 33 is formed along the axis of extent E in an oval shape, while recess 34 is a drilling. A second recess 35 is introduced into the support from the bottom surface 12 in the direction of mounting surface 11. Recess 35, like recess 33, has a basically oval shape along the axis of extent E, but it has a smaller extent in the direction of axis of extent E than recess 35. The lateral extent of recess 35 spans both the lateral extent of recess 33 and that of recess 34, so that the two penetrations 3 are formed by means of recess 35.

Figure 3:
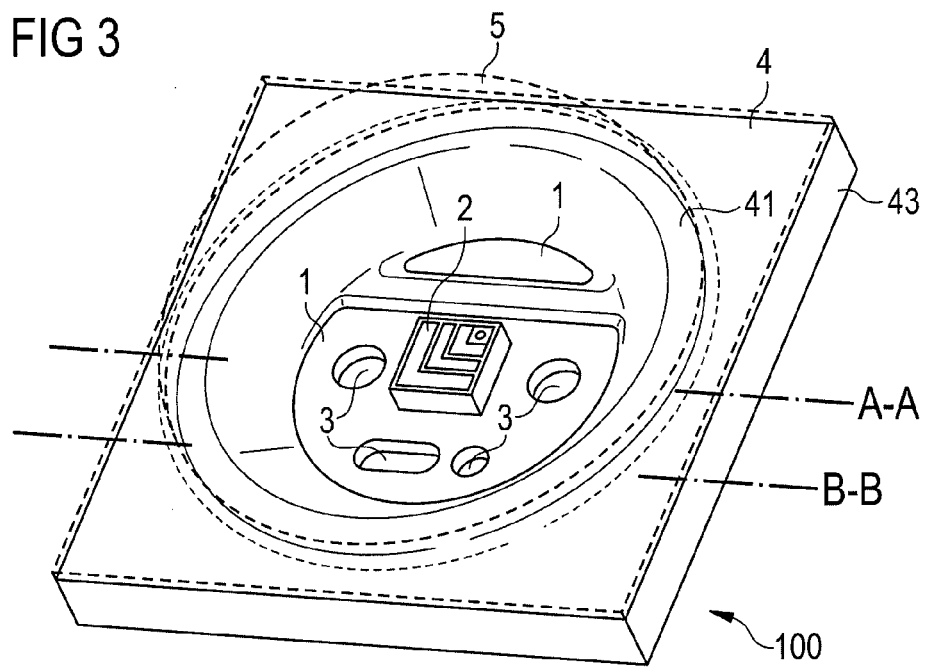
FIG. 3 shows a top view of an embodiment example of an optoelectronic semiconductor component as described here.
Figure 4:
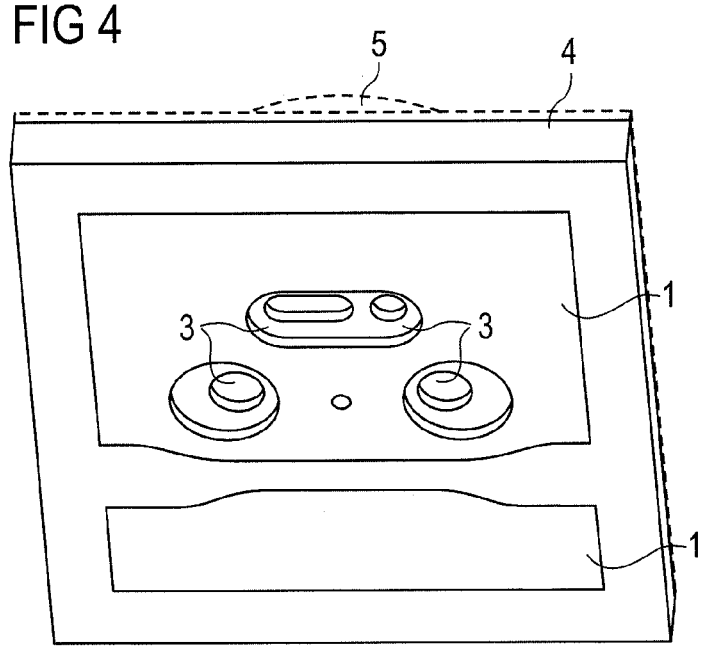
FIG. 4 shows a perspective view from below of an embodiment example of an optoelectronic semiconductor component, as described here.

FIG. 3 shows, in a schematic perspective top view, the optoelectronic semiconductor component 100 in accordance with FIGS. 1 and 2. One can see the penetrations 3 in support 1 and the semiconductor chip 2. Elevations 41 surround the semiconductor chip 2 in a circle In addition, FIG. 4 shows a schematic perspective view from the bottom of the optoelectronic semiconductor component as in FIG. 3 with penetrations 3, housing body 4 and casting body 5 and support 1.

A method described here for producing such a semiconductor component is explained in more detail in connection with FIGS. 5a, 5b, 5c and 5d by means of schematic sectional views.

Figure 5A:
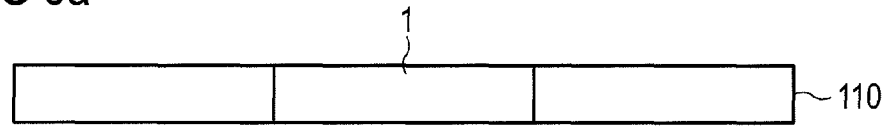
FIGS. 5a, 5b, 5c and 5d show schematic sectional views of individual manufacturing steps for manufacturing an embodiment example of an optoelectronic semiconductor component as described here.

FIG. 5a is a section through a group of supports 110 with a plurality of supports 1. In this case the group of supports 110 is a metallic support frame group.

Figure 5B:
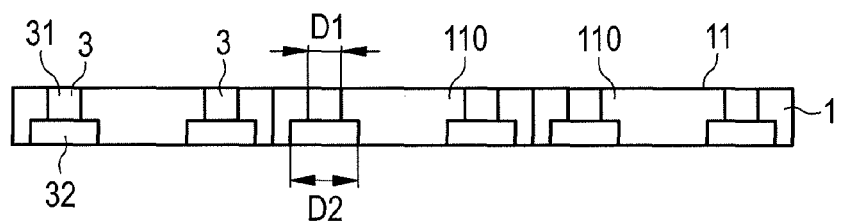

FIG. 5b shows the group of supports 110 with two penetrations 3 introduced into each support 1. The penetrations 3 are each formed by recess 31 and recess 32. Here recess 31 has a diameter D1 and recess 32 has a diameter D2, where diameter D2 is greater than diameter D1.

Figure 5C:
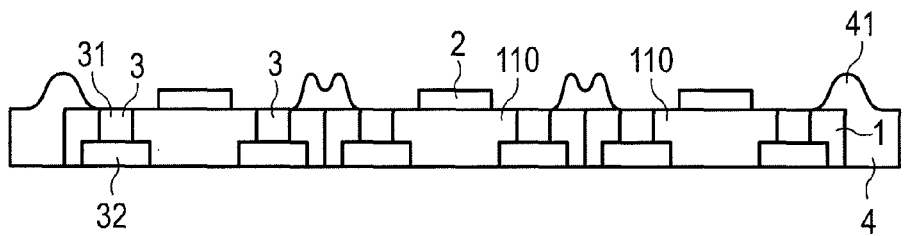

FIG. 5c shows how the optoelectronic semiconductor chip 2 is mounted on each mounting surface 11 of each support 1.

In addition, FIG. 5c shows how the housing body material hardens to a housing 4, for example by means of a suitable template. The bead-like elevations 41 form at the edge regions of each support 1, where the region in the vicinity of semiconductor chip 2 and penetrations 3 is itself free of housing body material.

Figure 5D:
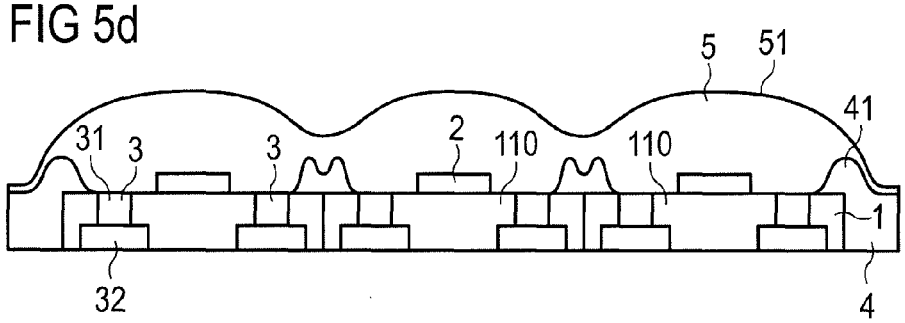

In another step it is shown in FIG. 5d how, after hardening the housing body material to from the housing body 4 the semiconductor chips 2 and the penetrations 3 are potted with a casting material in a similar casting operation. After hardening the casting material to form the casting body 5 a lens-shaped radiation decoupling surface 51 in the form of a condensing lens is formed. In addition, the casting body 5 transforms the elevations 41 completely.

Finally, the group of supports 110 is separated into individual optoelectronic semiconductor components 100 by means of sawing, cutting, breaking or stamping.

The invention is not limited by the description of the embodiment examples. Rather the invention covers each new trait as well as any combination of traits, which in particular involves any combination of traits in the claims, even if said trait or combination of traits itself is not explicitly specified in the claims or the embodiment examples.

The invention claimed is:

1. An optoelectronic semiconductor component comprising:
   a support formed by two metallic support parts, wherein the support has a mounting surface and at least one penetration, where the penetration extends from the mounting surface to a bottom surface of the support that lies opposite the mounting surface so that the support is completely punctuated by the penetration, wherein the penetration is formed as a hole with a side of the penetration being bounded by the support and with the penetration having a continuous side surface, wherein the at least one penetration has at least one projection;
   wherein the at least one penetration has a larger maximum lateral extent at a bottom surface side than at the mounting surface side,
   at least one optoelectronic semiconductor chip, which is mounted on the mounting surface; and
   a radiation-transparent casting body, which surrounds the at least one optoelectronic semiconductor chip at least in places,
   wherein the casting body is arranged at least in places in the penetration of the support,
   a housing body, wherein portions of the support not covered by the casting body are covered at least in places by the housing body, wherein the bottom surface side of the support is not covered by the housing body, and wherein in a top view onto the bottom surface side the support is completely surrounded by a continuous rail of the housing body, and
   wherein the housing body at least partially surrounds the optoelectronic semiconductor chip in a lateral direction, and wherein the housing body is applied between the two metallic support parts so that the housing body mechanically connects the support parts and electrically isolates them from each other.

2. The optoelectronic semiconductor component as claimed in claim 1, wherein the at least one penetration is formed by at least two recesses in the support, which differ from each other in their maximum lateral extent.

3. The optoelectronic semiconductor component as claimed in claim 2, wherein the recesses are formed by cylindrical openings with different radii.

4. The optoelectronic semiconductor component as claimed in claim 2, wherein the recesses have central axis and the central axis do not coincide.

5. The optoelectronic semiconductor component as claimed in claim 1 wherein the at least one penetration is made at least in places in a funnel shape, where the penetration tapers in the lateral direction from the bottom surface in the direction of the mounting surface.

6. The optoelectronic semiconductor component as claimed in claim 1, wherein the at least one semiconductor chip is bordered on its sides by elevations and/or depressions in the housing body.

7. The optoelectronic semiconductor component as in claim 6, wherein the elevations are made bead-like at least in places.

8. The optoelectronic semiconductor component as claimed in claim 6, wherein the depressions in the housing body are troughs.

9. The optoelectronic semiconductor component as claimed in claim 6, wherein the casting body transforms the elevations at least in places.

10. The optoelectronic semiconductor component as claimed in claim 6, wherein the casting body is arranged at least in places in the depressions.

11. A method for producing an optoelectronic semiconductor component as claimed in claim 1 comprising the steps of:
    provision of a group of supports;
    introduction of at least one penetration into each support;
    application of at least one optoelectronic semiconductor chip on a mounting surface of each support;
    potting the at least one semiconductor chip and the at least one penetration with a casting material and then hardening it onto a casting body; and
    separation of the group of supports into individual supports.

12. The method as claimed in claim 11, wherein before potting with the casting material the group of supports is potted with a housing body material.

13. An optoelectronic semiconductor component as claimed in claim 1, wherein at least one semiconductor chip is bordered on its sides by elevations in the housing body, wherein the casting body transforms the elevations and wherein in top view onto the mounting surface, the casting body completely covers the housing body.

14. An optoelectronic semiconductor component as claimed in claim 1, wherein the housing body completely fills the gap between the two metallic support parts.

15. An optoelectronic semiconductor component as claimed in claim 1, the support has an anchoring structure at its side surfaces, wherein the anchoring structure surrounds the support, and wherein the anchoring structure is completely transformed by the housing body.

16. An optoelectronic semiconductor component comprising:
    a support formed by two metallic support parts, wherein the support has a mounting surface and at least one penetration, where the penetration extends from the mounting surface to a bottom surface of the support that lies opposite the mounting surface, so that the support is completely punctuated by the penetration, wherein the penetration is formed as a. hole with the side of the penetration being bounded by the support and with the penetration having a continuous side surface, wherein the at least one penetration has at least one projection;

wherein the penetration has a larger maximum lateral extent at the bottom surface side than at the mounting surface side, at least one optoelectronic semiconductor chip, which is mounted on the mounting surface; and a radiation-transparent casting body, which surrounds the at least one optoelectronic semiconductor chip at least in places, wherein the casting body is arranged at least in places in the penetration of the support, a housing body, wherein the places of the support not covered by the casting body are covered at least in places by the housing body, wherein the bottom surface side of the support is not covered by the housing body, and wherein in a top view onto the bottom surface side the support is completely surrounded by a continuous rail of the housing body, and wherein the housing body at least partially surrounds the optoelectronic semiconductor chip in a lateral direction, and wherein the housing body is applied between the two metallic support parts so that the housing body mechanically connects the support parts and electrically isolates them from each other, the at least one semiconductor chip is bordered on its sides by elevations in the housing body, wherein the casting body transforms the elevations and wherein in top view onto the mounting surface, the casting body completely covers the housing body, the housing body completely fills the gap between the two metallic support parts, the support has an anchoring structure at its side surfaces, wherein the anchoring structure surrounds the support, and wherein the anchoring structure is completely transformed by the housing body.

* * * * *

UNITED STATES PATENT AND TRADEMARK OFFICE
CERTIFICATE OF CORRECTION

PATENT NO. : 8,946,756 B2
APPLICATION NO. : 13/256213
DATED : February 3, 2015
INVENTOR(S) : Michael Zitzlsperger et al.

It is certified that error appears in the above-identified patent and that said Letters Patent is hereby corrected as shown below:

In the Claims

In claim 7, line 1, after "as", insert --claimed--.

In claim 13, line 1, change "An" to --The--.

In claim 14, line 1, change "An" to --The--.

In claim 15, line 1, change "An" to --The--.

In claim 15, line 2, after the ",", insert --wherein--.

In claim 16, line 9, change "a." to --a--.

Signed and Sealed this
Twenty-eighth Day of July, 2015

Michelle K. Lee
*Director of the United States Patent and Trademark Office*